(12) United States Patent
Okada

(10) Patent No.: US 10,586,677 B1
(45) Date of Patent: Mar. 10, 2020

(54) SEMICONDUCTOR APPARATUS AND CHARGED PARTICLE RAY EXPOSURE APPARATUS

(71) Applicants: Kabushiki Kaisha Toshiba, Minato-ku, Tokyo (JP); Toshiba Electronic Devices & Storage Corporation, Minato-ku, Tokyo (JP)

(72) Inventor: Shiro Okada, Sagamihara Kanagawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 16/288,319

(22) Filed: Feb. 28, 2019

(30) Foreign Application Priority Data

Sep. 12, 2018 (JP) .................. 2018-170945

(51) Int. Cl.
*H01J 37/00* (2006.01)
*H01J 37/147* (2006.01)
*H01J 37/317* (2006.01)
*G03F 7/20* (2006.01)
*H01J 37/20* (2006.01)

(52) U.S. Cl.
CPC .......... *H01J 37/147* (2013.01); *G03F 7/2059* (2013.01); *H01J 37/20* (2013.01); *H01J 37/3177* (2013.01); *H01J 2237/20228* (2013.01); *H01J 2237/31774* (2013.01)

(58) Field of Classification Search
CPC ...... H01J 37/147; H01J 37/20; H01J 37/3177; H01J 2237/31774; H01J 2237/20228; G03F 7/2059
USPC ............... 250/306, 307, 310, 311, 396 R, 250/492.1–492.3
See application file for complete search history.

(56) References Cited

U.S. PATENT DOCUMENTS 8,691,666 B2   4/2014  Segawa et al.
2008/0283767 A1* 11/2008 Platzgummer ......... B82Y 10/00
                                         250/396 R
2013/0043413 A1*  2/2013  De Boer ............... B82Y 10/00
                                         250/492.3

FOREIGN PATENT DOCUMENTS

JP    H11-233673 A    8/1999
JP     5196838 B2    5/2013

* cited by examiner

*Primary Examiner* — Michael Maskell
(74) *Attorney, Agent, or Firm* — White & Case LLP

(57) ABSTRACT

A semiconductor apparatus according to an embodiment is a semiconductor apparatus including substrate having a recess provided at a first substrate face, a plurality of through holes provided in a predetermined region of the recess, and a plurality of protrusions provided on the recess in the predetermined region.

10 Claims, 5 Drawing Sheets

A-A'

B-B'

A-A'

A-A'

B-B'

SEMICONDUCTOR APPARATUS AND CHARGED PARTICLE RAY EXPOSURE APPARATUS

CROSS-REFERENCE TO RELATED APPLICATION

This application is based upon and claims the benefit of priority from Japanese Patent Application No. 2018-170945, filed on Sep. 12, 2018, the entire contents of which are incorporated herein by reference.

FIELD

Embodiments described herein relate generally to a semiconductor apparatus and a charged particle ray exposure apparatus.

BACKGROUND

Lithography technology plays an extremely important role in a process to advance the miniaturization of semiconductor devices. In recent years, along with the high integration of LSIs, the circuit line width required for semiconductor devices has been shortened year by year. Since electron ray (electron beam) drawing technology has inherently excellent resolution, the electron ray has been used to draw a mask pattern on a mask blank.

A drawing apparatus using a multi-electron beam (multibeam) can greatly improve the throughput as compared with a case of drawing with one electron beam. In such a multibeam drawing apparatus, for example, an electron beam emitted from an electron gun is passed through a shaping aperture having a plurality of holes to form a multibeam. Each electron beam constituting the formed multibeam is subjected to blanking control by a blanking aperture array. The electron beam deflected by the blanking aperture array is blocked (blanked), and a sample such as a mask blank is irradiated with the undeflected electron beam.

The blanking aperture array is provided with through holes through which the respective electron beams pass. And, a pair of electrodes for deflecting the electron beam is provided around each of the through holes. The manufacture of the blanking aperture array adopts a method in which each of the through holes and each of the pairs of electrodes described above are formed on, for example, a silicon (Si) substrate by using semiconductor manufacturing technology.

Herein, when a dicing tape is attached to the upper face of the through holes and then the dicing tape is peeled off in order to process the blanking aperture array or the like, there has been a problem that an adhesive of the dicing tape enters the through holes and remains inside.

DETAILED DESCRIPTION

Figure 1:
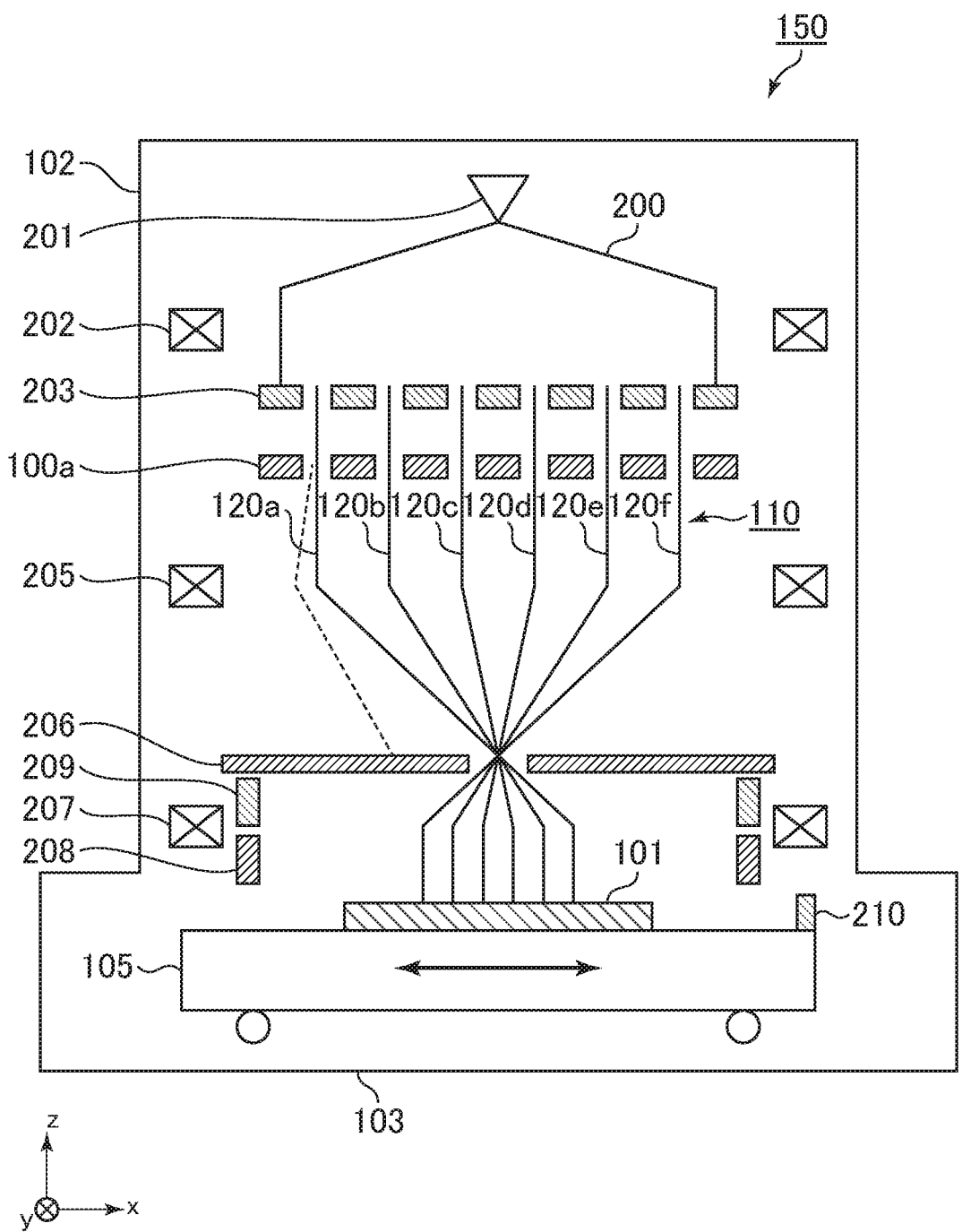
FIG. 1 is a schematic sectional view of an electron beam drawing apparatus according to an embodiment.

Hereinafter, embodiments will be described using the drawings. Note that the same or similar parts are denoted by the same or similar reference signs in the drawings.

In this specification, the same or similar members are denoted by the same reference signs, and redundant explanations may be omitted in some cases.

In this specification, in order to indicate the positional relationship of components and the like, the upward direction in the drawing is described as "upper," and the downward direction in the drawing is described as "lower." In this specification, the concepts of "upper" and "lower" are not necessarily terms indicating the relationship with the direction of gravity.

Hereinafter, a constitution using an electron beam as one example of a charged particle beam will be described. However, the charged particle beam is not limited to the electron beam and may be a beam using charged particles, such as an ion beam.

Embodiments

A semiconductor apparatus according to the present embodiment is a semiconductor apparatus including substrate having a recess provided on a first substrate face, a plurality of through holes provided in a predetermined region of the recess, and a plurality of protrusions provided on the recess in the predetermined region. A semiconductor apparatus according to the present embodiment is a substrate including a recess provided at a first face, a plurality of through holes provided in a bottom portion of the recess, and a plurality of protrusions provided on the bottom portion of the recess; a first electrode on the substrate, provided on each periphery of the plurality of through holes; a second electrode on the substrate, provided on each periphery of the plurality of through holes, the second electrode facing the first electrode; and a circuit electrically connected to the first electrode.

FIG. 1 is a schematic sectional view of an electron beam drawing apparatus 150 according to the present embodiment. The electron beam drawing apparatus 150 is one example of a multi-charged particle beam drawing apparatus or a charged particle ray exposure apparatus.

A semiconductor apparatus 100 according to the present embodiment is used as, for example, a blanking aperture array (polariscope) of the electron beam drawing apparatus 150. Note that the application of the semiconductor apparatus 100 is not limited to this.

The electron beam drawing apparatus 150 includes an electron lens barrel 102 (multi-electron beam column) and a drawing chamber 103. Disposed inside the electron lens barrel 102 are an electron gun 201, an illumination lens 202, a shaping aperture array 203, the semiconductor apparatus 100 (blanking aperture array), a reduction lens 205, a limiting aperture member 206, an objective lens 207, a main deflector 208 and a sub-deflector 209.

Herein, an x axis, a y axis perpendicular to the x axis, and a z axis perpendicular to the x axis and the y axis are defined. The electron gun 201 emits an electron beam 200 in a direction perpendicular to the z direction. And, a sample 101 is disposed in a plane parallel to the xy plane.

The illumination lens 202 illuminates the shaping aperture array 203 substantially vertically with the electron beam 200 emitted from the electron gun 201. Then, the electron beam 200 passes through openings of the shaping aperture array 203 and a multibeam 110 is formed. The multibeam 110 has electron beams 120*a*, 120*b*, 120*c*, 120*d*, 120*e* and 120*f*. The shape of each of the electron beams 120 reflects the shape of the opening of the shaping aperture array 203 and is, for example, rectangular. Note that FIG. 1 shows that the number of openings of the shaping aperture array 203 is six, but the number is not limited to this. The number of beams constituting the multibeam 110 formed by the shaping aperture array 203 is six in FIG. 1. However, the number of beams constituting the multibeam 110 to be formed is not limited to six, as a matter of course. As one example, 512 openings of the shaping aperture array 203 are disposed in matrix in each of the x direction and y direction.

The semiconductor apparatus 100 (100*a*) is provided under the shaping aperture array 203. The electron beams 120 deflected by the semiconductor apparatus 100 are displaced from the center hole of the limiting aperture member 206 and blocked by the limiting aperture member 206. On the other hand, the undeflected electron beams 120 pass through the center hole of the limiting aperture member 206. Accordingly, on/off of the electron beams is controlled.

The electron beams 120 passed through the limiting aperture member 206 are focused by the objective lens 207, become a pattern image with a desired reduction ratio, and are deflected collectively by the main deflector 208 and the sub-deflector 209. Then, the respective irradiation positions at the sample 101 placed on an XY stage 105 are irradiated. On the XY stage 105, a mirror 210 for measuring the position of the XY stage 105 is further disposed.

Figure 2:
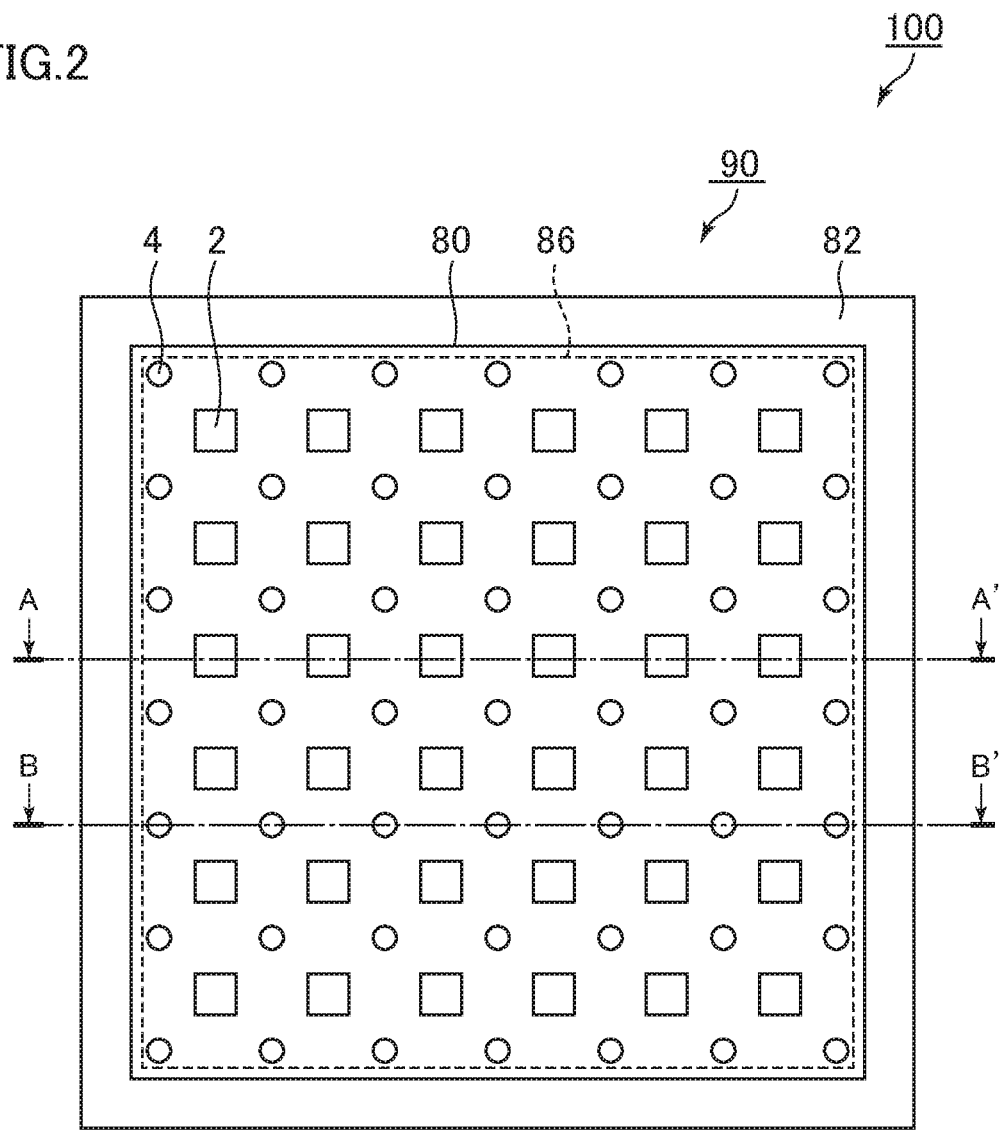
FIG. 2 is a schematic top view of the semiconductor apparatus according to the embodiment.
Figure 3A:
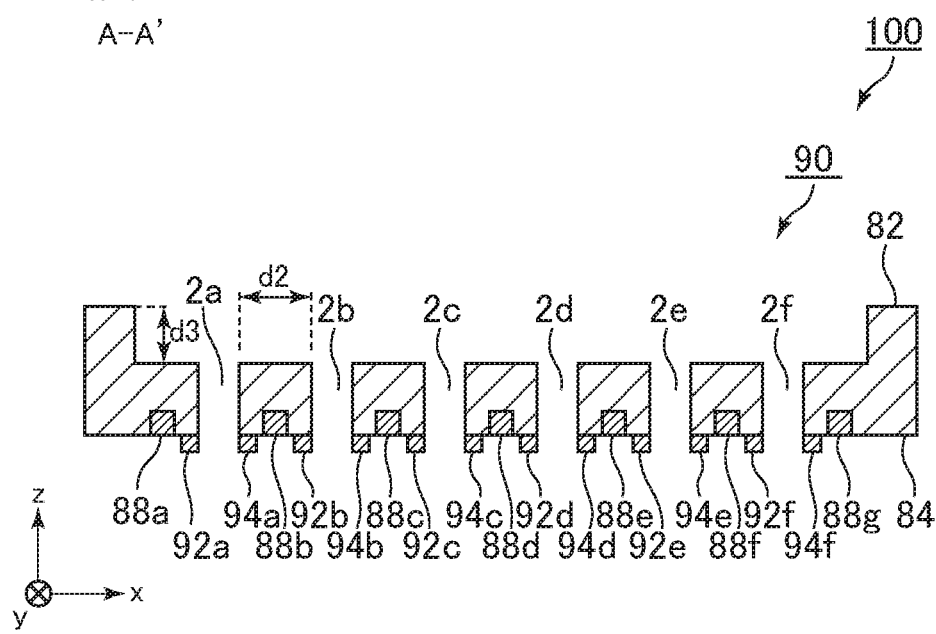
FIGS. 3A and 3B are schematic sectional views of the semiconductor apparatus according to the embodiment.
Figure 3B:
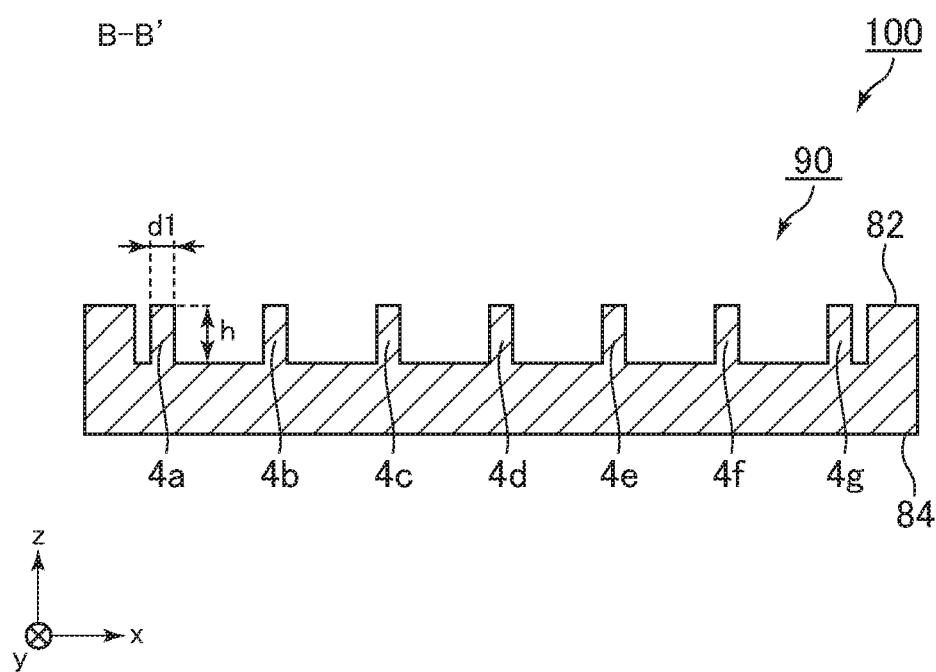

FIG. 2 is a schematic top view of the semiconductor apparatus 100 according to the embodiment. FIG. 3A is a schematic sectional view along the cross section A-A' of the semiconductor apparatus 100 shown in FIG. 2. FIG. 3B is a schematic sectional view along the cross section B-B' of the semiconductor apparatus 100 shown in FIG. 2. The semiconductor apparatus 100 according to the embodiment will be described using FIGS. 2, 3A and 3B.

The semiconductor apparatus 100 according to the embodiment includes a substrate 90. The substrate 90 is, for example, a semiconductor substrate. The substrate 90 is, for example, a silicon (Si) substrate. Note that the substrate 90 is not limited to the semiconductor substrate. The substrate 90 has a first substrate face 82 and a second substrate face 84.

The first substrate face 82 and the second substrate face 84 are disposed in parallel to the xy plane.

The substrate 90 has a recess 80 at the first substrate face 82. A plurality of through holes 2 are provided in a predetermined region 86 of the recess 80, which is indicated by the dotted line in FIG. 2. Herein, the predetermined region 86 is, for example, a portion excluding the end portion of the recess 80 where the through holes 2 are difficult to be formed. The shape of the through holes 2 is, for example, rectangular, but is not limited this. In FIG. 3A, through holes 2*a*, 2*b*, 2*c*, 2*d*, 2*e* and 2*f* are provided as the through holes 2. Note that a total of 36 through holes 2 are provided with six in the x direction and six in the y direction in FIG. 2. However, the number of through holes 2 is not limited to this.

A plurality of protrusions 4 are provided on the recess 80 in the predetermined region 86. For example, in FIGS. 2 and 3A, a grid of the through holes 2 having a square shape is disposed in the recess 80. Then, the protrusions 4 are disposed at the intersections of the grid in the recess 80, which are the remaining portions where the through holes 2 are not formed. In FIG. 3B, protrusions 4*a*, 4*b*, 4*c*, 4*d*, 4*e*, 4*f* and 4*g* are provided as the protrusions 4. Note that the protrusions 4 may be not disposed at all the intersections of the grid.

The recess 80 is formed, for example, by cutting the substrate 90 from the first substrate face 82. At this time, the protrusions 4 are preferably formed integrally with the substrate 90 by leaving and not cutting the corresponding portions of the substrate 90. Note that the protrusions 4 may be formed by adhering separate components onto the recess 80 to be the protrusions 4 after the recess 80 is formed.

The through holes 2 are formed, for example, by cutting or the like after the recess 80 is formed.

The shape of the cross sections of the protrusions 4 in the plane parallel to the first substrate face 82 or the second substrate face 84 is preferably ellipsoidal.

A height $h_1$ of the protrusions 4 is preferably equal to or greater than 5 μm.

A first length $d_1$ of the protrusions 4 in the direction parallel to the first substrate face 82 or the second substrate face 84 is equal to or less than a second length $d_2$ of portions between the through holes 2 at the substrate 90 in the direction parallel to the first substrate face 82 or the second substrate face 84, and is preferably, for example, equal to or greater than 5 μm. Note that the depth of the recess 80 is $d_3$.

A power supply electrode 92 is provided at the second substrate face 84. In FIG. 3A, power supply electrodes 92*a*, 92*b*, 92*c*, 92*d*, 92*e* and 92*f* are provided as the power supply electrodes 92. Note that the power supply electrode is one example of a first electrode.

A ground electrode 94 is provided at the second substrate face 84. In FIG. 3A, ground electrodes 94*a*, 94*b*, 94*c*, 94*d*, 94*e* and 94*f* are provided as the ground electrodes 94. In the electron beam drawing apparatus 150, the ground electrode 94 is grounded to the ground by wiring (not shown). Note that the ground electrode is one example of a second electrode.

For example, the plurality of power supply electrodes 92 and the plurality of ground electrodes 94 are provided in FIGS. 3A and 3B. Each of the power supply electrodes 92 is provided around each of the through holes 2. And, each of the ground electrodes 94 is provided around each of the through holes 2 with the through holes 2 interposed between the ground electrodes 94.

A circuit 88 is provided at the second substrate face 84. In FIG. 3A, circuits 88*a*, 88*b*, 88*c*, 88*d*, 88*e*, 88*f* and 88*g* are provided as the circuits 88. The circuit 88 is, for example, a complementary metal-oxide-semiconductor (CMOS) circuit. The circuit 88 is connected to the power supply electrode 92 by wiring (not shown). The circuit 88 has a function of applying a predetermined voltage of, for example, about 5V to the power supply electrode 92.

The electron beams 120 shaped by the shaping aperture array 203 pass through the respective through holes 2. Herein, when the predetermined voltage is applied to the power supply electrode 92, for example, by using the circuit 10, an electric field is generated between the power supply electrode 92 and the ground electrode 94. The electron beams 120 passing through the through holes 2 at the portions where the electric fields are generated are deflected.

Note that the electron beams 120 may pass from the top to the bottom or may pass from the bottom to the top in the drawings of FIGS. 3A and 3B.

Figure 4A:
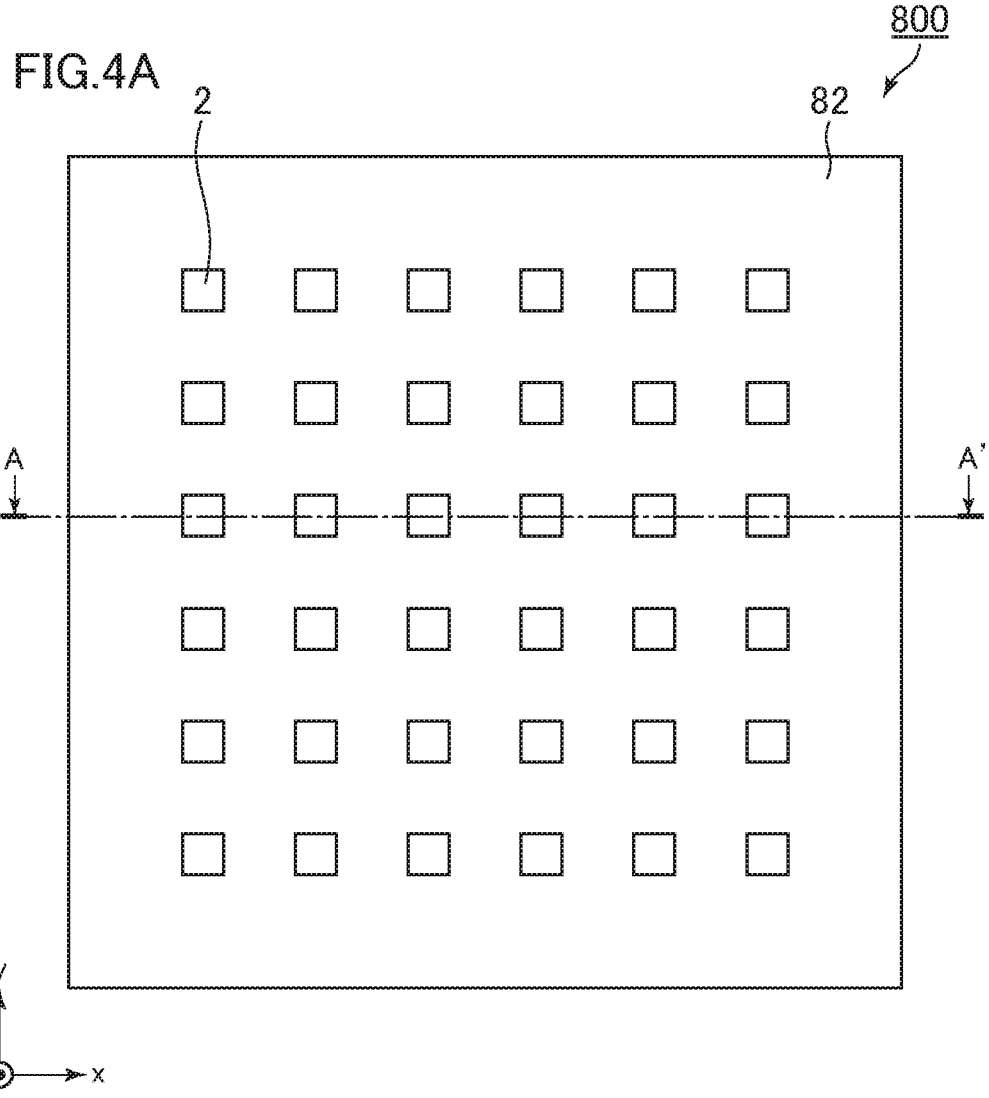
FIGS. 4A and 4B are schematic views of a semiconductor apparatus according to a comparative embodiment.
Figure 4B:
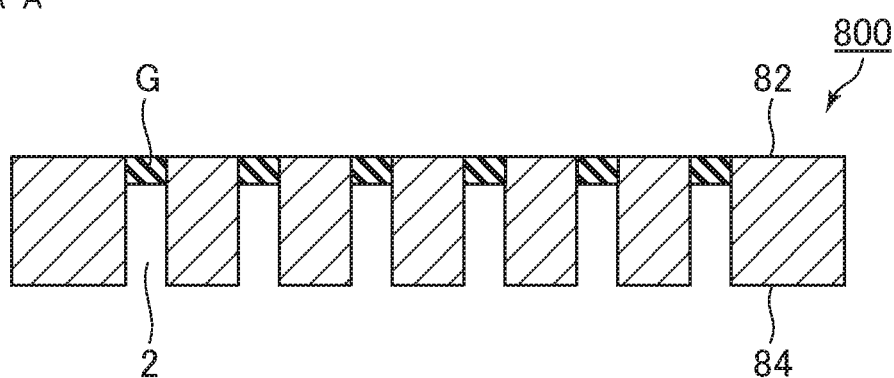

FIGS. 4A and 4B are schematic views of a semiconductor apparatus 800 according to a comparative embodiment of the embodiment. FIG. 4A is a schematic top view of the semiconductor apparatus 800. FIG. 4B is a schematic sectional view along the cross section A-A' of the semiconductor apparatus 800 shown in FIG. 4A. The semiconductor apparatus 800 does not have a recess 80. Moreover, the semiconductor apparatus 800 does not have a protrusion 4 either.

In a case where a dicing tape T is to be attached to a first substrate face 82 of the semiconductor apparatus 800 and peeled off, there has been a problem that an adhesive G of the dicing tape T remains inside a through hole 2 as shown in FIG. 4B.

Figure 5A:
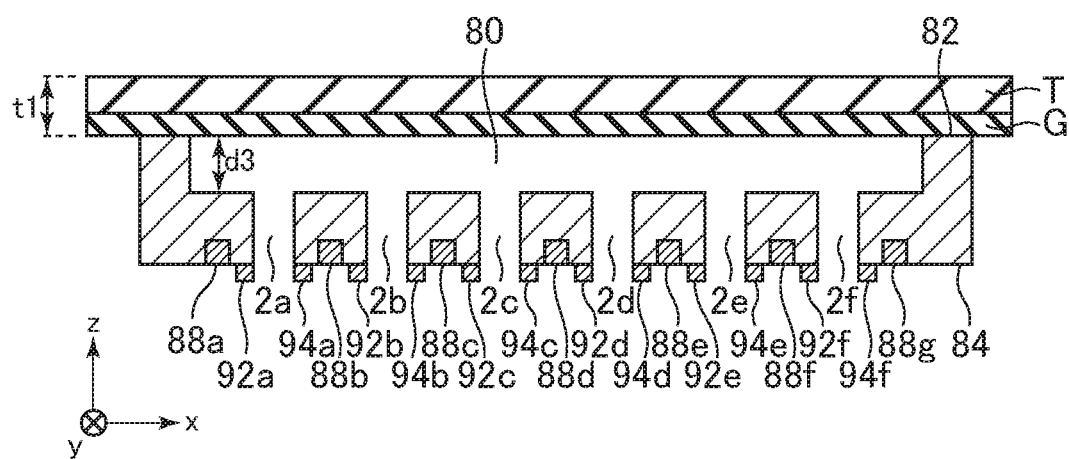
FIGS. 5A and 5B are views illustrating the effects of the semiconductor apparatus according to the embodiment.
Figure 5B:
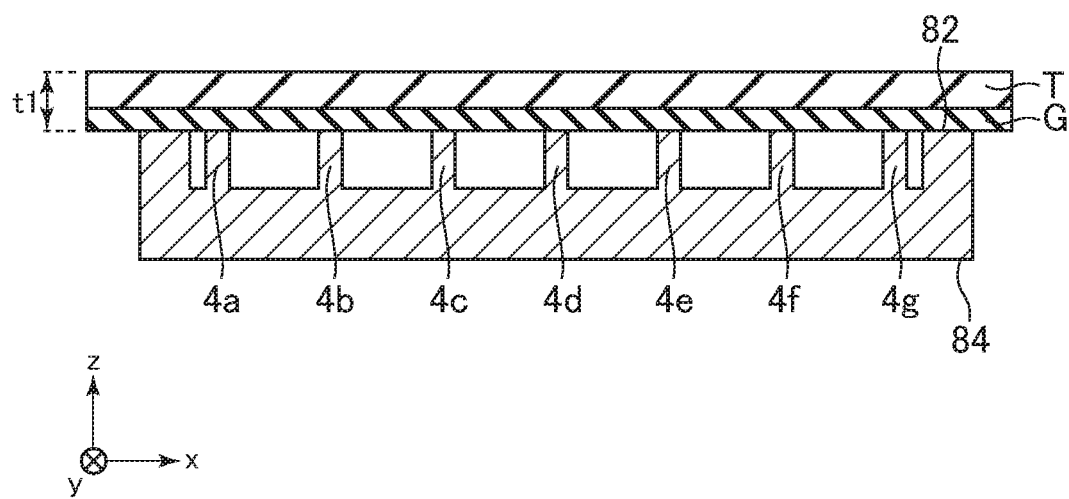

FIGS. 5A and 5B are views illustrating the effects of the semiconductor apparatus 100 according to the embodiment. FIG. 5A is a schematic sectional view when a dicing tape T is attached to the cross section A-A' of the semiconductor apparatus 100 shown in FIG. 3A. FIG. 5B is a schematic sectional view when the dicing tape T is attached to the cross section B-B' of the semiconductor apparatus 100 shown in FIG. 3B.

Since the recess 80 is provided, the adhesive G of the dicing tape T is attached to nowhere at the cross section A-A' of the first substrate face 82 except for the end portion. Therefore, since the adhesive G is difficult to be attached, the semiconductor apparatus 100 according to the embodiment can suppress the remaining of the adhesive G of the tape inside the through hole 2 more than the semiconductor apparatus 800 according to the comparative embodiment.

The shape of the cross sections of the protrusions 4 in the plane parallel to the first substrate face 82 or the second substrate face 84 is preferably ellipsoidal. This is because the adhesion of the adhesive G at the protrusions 4 can be suppressed.

The protrusions 4 are preferably formed integrally with the substrate 90 for easy manufacture.

A height $h_1$ of the protrusions 4 is preferably equal to or greater than 5 µm. This is because, in a case where the height $h_1$ is less than 5 µm, the adhesive G of the dicing tape T is likely to pass through the through holes 2 and attach to the portion under the recess 80.

A first length $d_1$ of the protrusions 4 in the direction parallel to the first substrate face 82 or the second substrate face 84 is equal to or less than a second length $d_2$ of portions between the through holes 2 at the substrate 90 in the direction parallel to the first substrate face 82 or the second substrate face 84, and is preferably, for example, equal to or greater than 5 µm. This is because the processing becomes easy when $d_1$ is equal to or less than $d_2$, and the strength of the protrusions 4 is maintained when $d_1$ is equal to or greater than 5 µm.

The power supply electrode 92, the ground electrode 94 and the circuit 88 are preferably provided at the second substrate face 84. This is to prevent the processing of the recess 80 from being disturbed.

The depth $d_3$ of the recess 80 is preferably thinner than the thickness of the adhesive G of the dicing tape T. This is to prevent the adhesive G from adhering to the bottom of the recess 80. Note that the depth $d_3$ of the recess 80 and the height $h_1$ of the protrusion 4 may be the same in some cases.

Moreover, in consideration of a flexible volume c of the dicing tape T, the depth $d_3$ of the recess 80 is preferably thinner than $t_2$ which is the sum of the film thickness of the dicing tape T, the film thickness of the adhesive G and the flexible volume c of the dicing tape T. This is to prevent the adhesive G from adhering to the bottom of the recess 80.

While certain embodiments have been described, these embodiments have been presented by way of example only, and are not intended to limit the scope of the inventions. Indeed, a semiconductor apparatus and a charged particle ray exposure apparatus described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor apparatus comprising:
   a substrate comprising a recess provided at a first face, a plurality of through holes provided in a bottom portion of the recess, and a plurality of protrusions provided on the bottom portion of the recess;
   a first electrode on the substrate, provided on each periphery of the plurality of through holes;
   a second electrode on the substrate, provided on each periphery of the plurality of through holes, the second electrode facing the first electrode; and
   a circuit electrically connected to the first electrode.

2. The semiconductor apparatus according to claim 1, wherein a shape of cross sections of the protrusions in a plane parallel to the first face is ellipsoidal.

3. The semiconductor apparatus according to claim 1, wherein the protrusions are integrally formed with the substrate.

4. The semiconductor apparatus according to claim 1, wherein a height of the protrusions is equal to or greater than 5 µm.

5. The semiconductor apparatus according to claim 1, wherein a first length of the protrusions in a direction parallel to the first face is equal to or less than a second length of a portion between the through holes at the substrate in a direction parallel to the first face.

6. The semiconductor apparatus according to claim 5, wherein the first length is equal to or greater than 5 µm and equal to or less than the second length.

7. The semiconductor apparatus according to claim 1, wherein the substrate further includes a second substrate face, and the semiconductor apparatus further comprises a circuit provided at the second substrate face.

8. The semiconductor apparatus according to claim 7, wherein the substrate comprises a second face, the first electrode and the second electrode provided at the second face.

9. The semiconductor apparatus according to claim 1, wherein the semiconductor apparatus is a polariscope.

10. A charged particle ray exposure apparatus comprising the polariscope according to claim 9.

* * * * *